(12) United States Patent  
Mochizuki et al.

(10) Patent No.: US 8,278,920 B2  
(45) Date of Patent: Oct. 2, 2012

(54) MAGNETIC SENSOR AND MAGNETIC MEASUREMENT METHOD

(75) Inventors: Miho Mochizuki, Saitama-ken (JP); Toru Takeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 580 days.

(21) Appl. No.: 12/542,103

(22) Filed: Aug. 17, 2009

(65) Prior Publication Data

US 2010/0052671 A1 Mar. 4, 2010

(30) Foreign Application Priority Data

Aug. 27, 2008 (JP) ................................. 2008-218653

(51) Int. Cl.
*G01R 33/06* (2006.01)
(52) U.S. Cl. ...................... 324/251; 324/207.2
(58) Field of Classification Search ............... 324/207.2, 324/251

See application file for complete search history.

(56) References Cited

U.S. PATENT DOCUMENTS

| 4,037,150 | A | 7/1977 | Taranov et al. | |
| 4,761,569 | A | 8/1988 | Higgs | |
| 5,406,202 | A * | 4/1995 | Mehrgardt et al. | ........... 324/251 |
| 6,727,684 | B2 | 4/2004 | Hatanaka | |
| 6,777,932 | B2 * | 8/2004 | Hara et al. | ................... 324/251 |
| 2008/0197834 | A1 | 8/2008 | Takeda | |

FOREIGN PATENT DOCUMENTS

| JP | 2001-337147 | 12/2001 |
| JP | 2004-037221 | 2/2004 |
| JP | 2004-180286 | 6/2004 |
| JP | 2005-003541 | 1/2005 |
| JP | 2005-283503 | 10/2005 |
| JP | 2007-192647 | 8/2007 |

OTHER PUBLICATIONS

Japanese Office Action for 2008-218653 mailed on Oct. 13, 2010.

* cited by examiner

*Primary Examiner* — Reena Aurora
(74) *Attorney, Agent, or Firm* — Turocy & Watson, LLP (57) ABSTRACT

For a Hall element of a magnetic sensor, a current is caused to pass along a +X-direction and a first voltage is measured in a +Y-direction, a current is caused to pass along the +Y-direction and a second voltage is measured in the +X-direction, a current is caused to pass along a −X-direction and a third voltage is measured in the +Y-direction, and a current is caused to pass along a −Y-direction and a fourth voltage is measured in the +X-direction. Then, a calculation is performed which strengthens effects of Hall voltage mutually and weakens effects of offset voltage mutually based on a value of the first voltage and a value of the second voltage, and the result is compared with a reference value. Furthermore, a calculation is performed which strengthens effects of Hall voltage mutually and weakens effects of offset voltage mutually based on a value of the third voltage and a value of the fourth voltage, and the result is compared with the reference value.

18 Claims, 11 Drawing Sheets

FIG. 1

| POLARITY TO BE DETECTED | S | S | N | N |
|---|---|---|---|---|
| SWITCH ELEMENT | PHASE 1 | PHASE 2 | PHASE 3 | PHASE 4 |
| A | OFF | OFF | ON | OFF |
| B | OFF | OFF | OFF | ON |
| C | ON | OFF | OFF | OFF |
| D | OFF | ON | OFF | OFF |
| E | ON | OFF | OFF | OFF |
| F | OFF | ON | OFF | OFF |
| G | OFF | OFF | ON | OFF |
| H | OFF | OFF | OFF | ON |
| I | OFF | ON | OFF | ON |
| J | ON | OFF | ON | OFF |
| K | OFF | ON | OFF | ON |
| L | ON | OFF | ON | OFF |

FIG. 4A PHASE 1 (S POLE)   FIG. 4B PHASE 2 (S POLE)

FIG. 4C PHASE 3 (N POLE)   FIG. 4D PHASE 4 (N POLE)

FIG. 5

| POLARITY TO BE DETECTED | S | S | N | N |
|---|---|---|---|---|
| SWITCH ELEMENT | PHASE 1 | PHASE 2 | PHASE 3 | PHASE 4 |
| A | OFF | OFF | OFF | ON |
| B | ON | OFF | OFF | OFF |
| C | OFF | ON | OFF | OFF |
| D | OFF | OFF | ON | OFF |
| E | OFF | ON | OFF | OFF |
| F | OFF | OFF | ON | OFF |
| G | OFF | OFF | OFF | ON |
| H | ON | OFF | OFF | OFF |
| I | ON | OFF | ON | OFF |
| J | OFF | ON | OFF | ON |
| K | ON | OFF | ON | OFF |
| L | OFF | ON | OFF | ON |

FIG. 6

FIG. 7A  PHASE 1 (S POLE)    FIG. 7B  PHASE 2 (S POLE)

FIG. 7C  PHASE 3 (N POLE)    FIG. 7D  PHASE 4 (N POLE)

FIG. 8A

FIG. 8B $M_0$: THRESHOLD    $V_0$: REFERENCE VALUE

FIG. 9

| POLARITY TO BE DETECTED | S | S | N | N |
|---|---|---|---|---|
| SWITCH ELEMENT | PHASE 1 | PHASE 2 | PHASE 3 | PHASE 4 |
| A PMOS | Vdd/- OFF | Vdd/- OFF | 0/- ON | Vdd/- OFF |
| B PMOS | Vdd/- OFF | Vdd/- OFF | Vdd/- OFF | 0/- ON |
| C PMOS | 0/- ON | Vdd/- OFF | Vdd/- OFF | Vdd/- OFF |
| D PMOS | Vdd/- OFF | 0/- ON | Vdd/- OFF | Vdd/- OFF |
| E NMOS | -/Vdd ON | -/0 OFF | -/0 OFF | -/0 OFF |
| F NMOS | -/0 OFF | -/Vdd ON | -/0 OFF | -/0 OFF |
| G NMOS | -/0 OFF | -/0 OFF | -/Vdd ON | -/0 OFF |
| H NMOS | -/0 OFF | -/0 OFF | -/0 OFF | -/Vdd ON |
| I P/N MOS | Vdd/0 OFF | 0/Vdd ON | Vdd/0 OFF | 0/Vdd ON |
| J P/N MOS | 0/Vdd ON | Vdd/0 OFF | 0/Vdd ON | Vdd/0 OFF |
| K P/N MOS | Vdd/0 OFF | 0/Vdd ON | Vdd/0 OFF | 0/Vdd ON |
| L P/N MOS | 0/Vdd ON | Vdd/0 OFF | 0/Vdd ON | Vdd/0 OFF |

MAGNETIC SENSOR AND MAGNETIC MEASUREMENT METHOD

CROSS-REFERENCE TO RELATED APPLICATIONS

This application is based upon and claims the benefit of priority from the prior Japanese Patent Application No. 2008-218653, filed on Aug. 27, 2008; the entire contents of which are incorporated herein by reference.

BACKGROUND OF THE INVENTION

1. Field of the Invention

This invention relates to a magnetic sensor and a magnetic measurement method, and more particularly to a magnetic sensor and a magnetic measurement method using a Hall element.

2. Background Art

Conventionally, magnetic sensors using Hall elements have been developed. A Hall element is a semiconductor element which detects magnetic field using the Hall effect. The Hall effect is a phenomenon in which, when a magnetic field is applied in a direction orthogonal to the current flowing direction, a voltage (Hall voltage) occurs in the direction orthogonal to both the current direction and the magnetic field direction.

A Hall element illustratively includes a square diffusion region in an upper portion of a silicon substrate. This diffusion region is illustratively an N-type region surrounded by a P-type region. A current is passed along a first direction in this diffusion region. At this time, if a magnetic field is applied in the direction perpendicular to the upper surface of the silicon substrate, a Hall voltage occurs along a second direction orthogonal to the first direction in the diffusion region. The magnetic field is detected by measuring this Hall voltage.

In such a Hall element, besides the Hall voltage, an offset voltage may occur due to, for instance, the stress applied to the silicon substrate and the error of the shape of the diffusion region. If an offset voltage occurs, a certain voltage is unfortunately detected even without application of a magnetic field to the Hall element. In this regard, U.S. Pat. No. 4,037,150 and JP-A-2001-337147 disclose a technique for canceling the effect of the offset voltage by performing the measurement twice with the direction of passing a current and the direction of measuring the voltage interchanged with each other, and calculating the sum or difference of the measurement results.

However, even the above technique for performing the measurement twice cannot completely cancel the effect of the offset voltage, but a residual component of the offset voltage remains in the measured voltage. The polarity of this residual component depends on the direction of the magnetic field to be detected. Hence, in such cases as binary determination in which the presence or absence of magnetism is determined by whether the absolute value of the measured voltage exceeds a certain threshold, there is a problem of inaccurate detection if the polarity of magnetism to be detected is unknown.

Such a magnetic sensor is illustratively used to detect the open/closed state of a mobile phone. In this case, a magnet is provided in one part of the foldable mobile phone, and a magnetic sensor is provided in the other part thereof, so that the magnet comes near the magnetic sensor when the mobile phone is closed. When the voltage generated in the Hall element exceeds a predetermined threshold, it is determined that the mobile phone is closed. Here, if the arrangement direction of the magnet is completely controlled, the polarity of the magnet on the magnetic sensor side is fixed to one of the S pole and the N pole, which allows detection in consideration of the residual component. However, if the arrangement direction of the magnet is not controlled, the detection accuracy decreases because the polarity of the magnet is unknown.

Conventionally, in such cases, the magnetic sensor includes two Hall elements, one for detecting the N pole and one for detecting the S pole. This is an obstacle to downsizing the magnetic sensor.

SUMMARY OF THE INVENTION

According to an aspect of the invention, there is provided a magnetic sensor including: a Hall element; and a control device, passing a current through the Hall element along a first direction and measuring a first voltage in a second direction orthogonal to the first direction, passing a current through the Hall element along the second direction and measuring a second voltage in the first direction, passing a current through the Hall element along a third direction opposite to the first direction and measuring a third voltage in the second direction, passing a current through the Hall element along a fourth direction opposite to the second direction and measuring a fourth voltage in the first direction, performing calculation which strengthens effects of Hall voltage mutually and weakens effects of offset voltage mutually based on a value of the first voltage and a value of the second voltage, and comparing a result thereof with a reference value, and performing calculation which strengthens effects of Hall voltage mutually and effects of offset voltage mutually based on a value of the third voltage and a value of the fourth voltage, and comparing a result thereof with the reference value.

According to another aspect of the invention, there is provided a magnetic sensor including: a Hall element including a first to fourth terminals sequentially placed along one rotational direction at a peripheral portion thereof; and a switch circuit switching connection relations of a high potential side power supply potential, a low potential side power supply potential, a first sense terminal, and a second sense terminal to the first to fourth terminals, the switch circuit including: a first switch element switching whether to connect the first terminal to the high potential side power supply potential; a second switch element switching whether to connect the second terminal to the high potential side power supply potential; a third switch element switching whether to connect the third terminal to the high potential side power supply potential; a fourth switch element switching whether to connect the fourth terminal to the high potential side power supply potential; a fifth switch element switching whether to connect the first terminal to the low potential side power supply potential; a sixth switch element switching whether to connect the second terminal to the low potential side power supply potential; a seventh switch element switching whether to connect the third terminal to the low potential side power supply potential; an eighth switch element switching whether to connect the fourth terminal to the low potential side power supply potential; a ninth switch element switching whether to connect the first terminal to the first sense terminal; a tenth switch element switching whether to connect the second terminal to the first sense terminal; an eleventh switch element switching whether to connect the third terminal to the second sense terminal; and a twelfth switch element switching whether to connect the fourth terminal to the second sense terminal.

According to another aspect of the invention, there is provided a magnetic sensor including: a Hall element; and a control device passing a current through the Hall element and measuring a voltage in the Hall element, the control device allowing polarity of a residual component in detecting S-pole magnetism and polarity of a residual component in detecting N-pole magnetism to be appeared in the same direction.

According to another aspect of the invention, there is provided a magnetic measurement method including: passing a current through a Hall element along a first direction and measuring a first voltage in a second direction orthogonal to the first direction; passing a current through the Hall element along the second direction and measuring a second voltage in the first direction; passing a current through the Hall element along a third direction opposite to the first direction and measuring a third voltage in the second direction; passing a current through the Hall element along a fourth direction opposite to the second direction and measuring a fourth voltage in the first direction; performing calculation which strengthens effects of Hall voltage mutually and weakens effects of offset voltage mutually based on a value of the first voltage and a value of the second voltage, and comparing a result thereof with a reference value; and performing calculation which strengthens effects of Hall voltage mutually and weakens effects of offset voltage mutually based on a value of the third voltage and a value of the fourth voltage, and comparing a result thereof with the reference value.

BRIEF DESCRIPTION OF THE DRAWINGS

FIG. 8A shows the comparative example, and FIG. 8B shows the first embodiment;

DETAILED DESCRIPTION OF THE INVENTION

Embodiments of the invention will now be described with reference to the drawings.

At the outset, a first embodiment of the invention is described.

Figure 1:
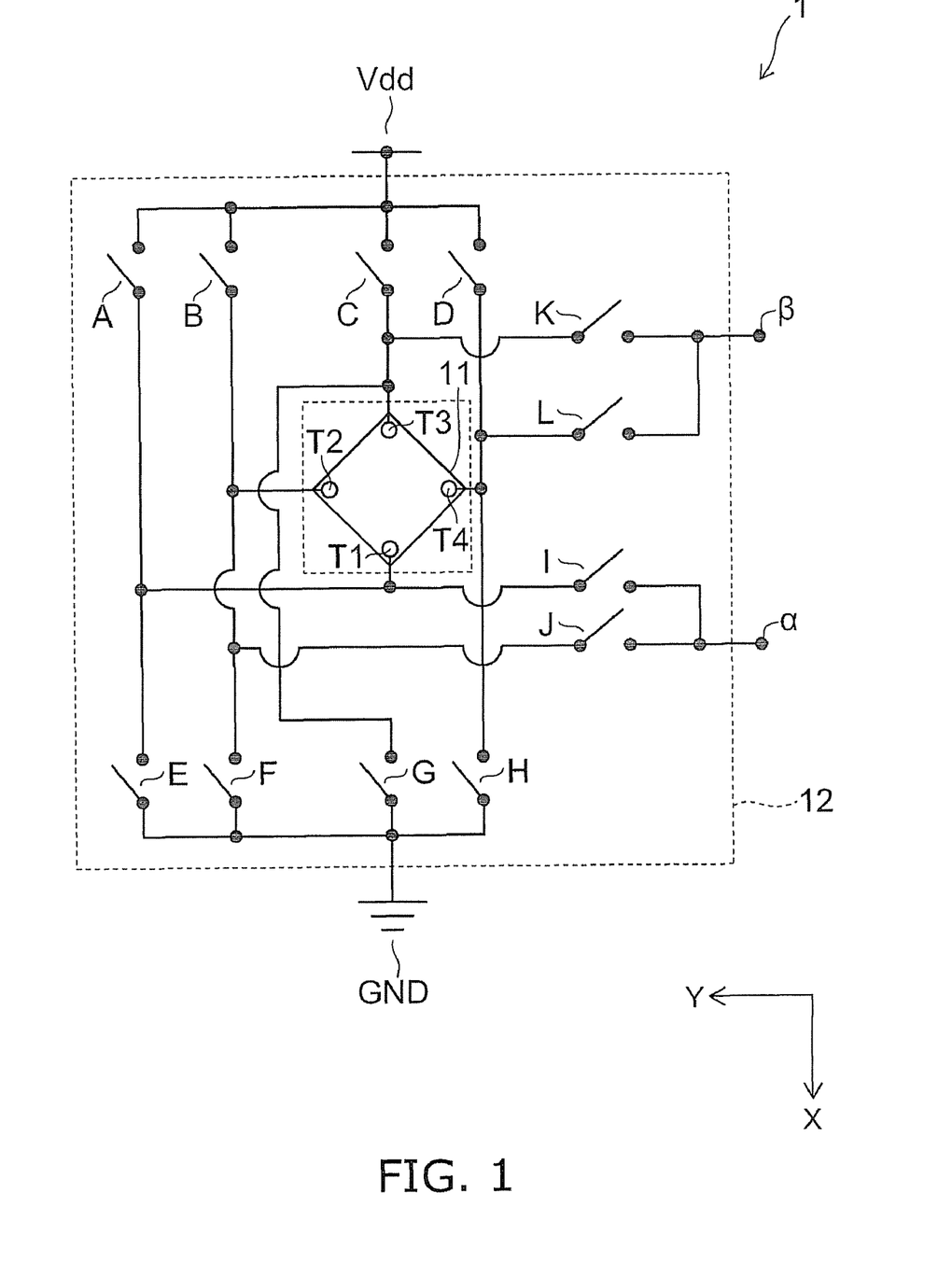
FIG. 1 is a circuit diagram illustrating a magnetic sensor according to a first embodiment of the invention.

FIG. 1 is a circuit diagram illustrating a magnetic sensor according to this embodiment.

As shown in FIG. 1, a high potential side power supply potential Vdd and a low potential side power supply potential GND are applied to the magnetic sensor 1 according to this embodiment, and a pair of sense terminals α and β is extracted from the magnetic sensor 1.

The magnetic sensor 1 includes a Hall element 11 and a switch circuit 12. The magnetic sensor 1 illustratively includes a silicon substrate (not shown). An N-type region surrounded by a P-type region is formed in an upper portion of this silicon substrate and constitutes the Hall element 11. That is, the Hall element 11 includes an impurity diffusion region (N-type region) formed in an upper portion of the silicon substrate and electrically isolated from the surroundings. The N-type region in the Hall element 11 has a generally planar shape, having fourfold symmetry with respect to the central axis, such as a square shape, as viewed in the direction perpendicular to the upper surface of the silicon substrate, or as viewed from above.

Terminals T1-T4 are provided at a peripheral portion of the Hall element 11, such as the respective vertex sides of the square. The terminals T1-T4 are placed in this order along one rotational direction, such as clockwise as viewed from above. Hence, the terminals T1-T4 are placed at positions having fourfold symmetry with respect to the central axis of the Hall element 11. In this embodiment, the direction from the terminal T3 to the terminal T1 is referred to as "+X-direction", the direction from the terminal T1 to the terminal T3 is referred to as "−X-direction", the direction from the terminal T4 to the terminal T2 is referred to as "+Y-direction", and the direction from the terminal T2 to the terminal T4 is referred to as "−Y-direction". The +X-direction and the +Y-direction are orthogonal to each other. Furthermore, because the Hall element 11 has a generally planar shape, the +X-direction and the +Y-direction are parallel to the upper surface of the Hall element 11.

The switch circuit 12 serves to switch the connection relations of the potential Vdd, the potential GND, and the sense terminals α and β to the terminals T1-T4 of the Hall element 11. The switch circuit 12 includes twelve switch elements A-L. The switch elements A-L are divided into three groups, each including four switch elements. More specifically, one end of the switch elements A-D is connected to the high potential side power supply potential Vdd, one end of the switch elements E-H is connected to the low potential side power supply potential GND, and one end of the switch elements I-L is connected to the sense terminal α or β. Furthermore, the other end of the switch elements A-D is connected respectively to the terminals T1-T4, the other end of the switch elements E-H is connected respectively to the terminals T1-T4, and the other end of the switch elements I-L is connected respectively to the terminals T1-T4.

Hence, the switch element A switches whether to connect the terminal T1 to the potential Vdd, the switch element B switches whether to connect the terminal T2 to the potential Vdd, the switch element C switches whether to connect the terminal T3 to the potential Vdd, and the switch element D switches whether to connect the terminal T4 to the potential Vdd. Furthermore, the switch element E switches whether to connect the terminal T1 to the potential GND, the switch element F switches whether to connect the terminal T2 to the potential GND, the switch element G switches whether to connect the terminal T3 to the potential GND, and the switch element H switches whether to connect the terminal T4 to the potential GND. Moreover, the switch element I switches whether to connect the terminal T1 to the sense terminal α, the switch element J switches whether to connect the terminal T2 to the sense terminal α, the switch element K switches whether to connect the terminal T3 to the sense terminal β, and the switch element L switches whether to connect the terminal T4 to the sense terminal β.

Next, a description is given of a method for driving the magnetic sensor 1 according to this embodiment configured as above, that is, a magnetic measurement method according to this embodiment.

Figure 2:
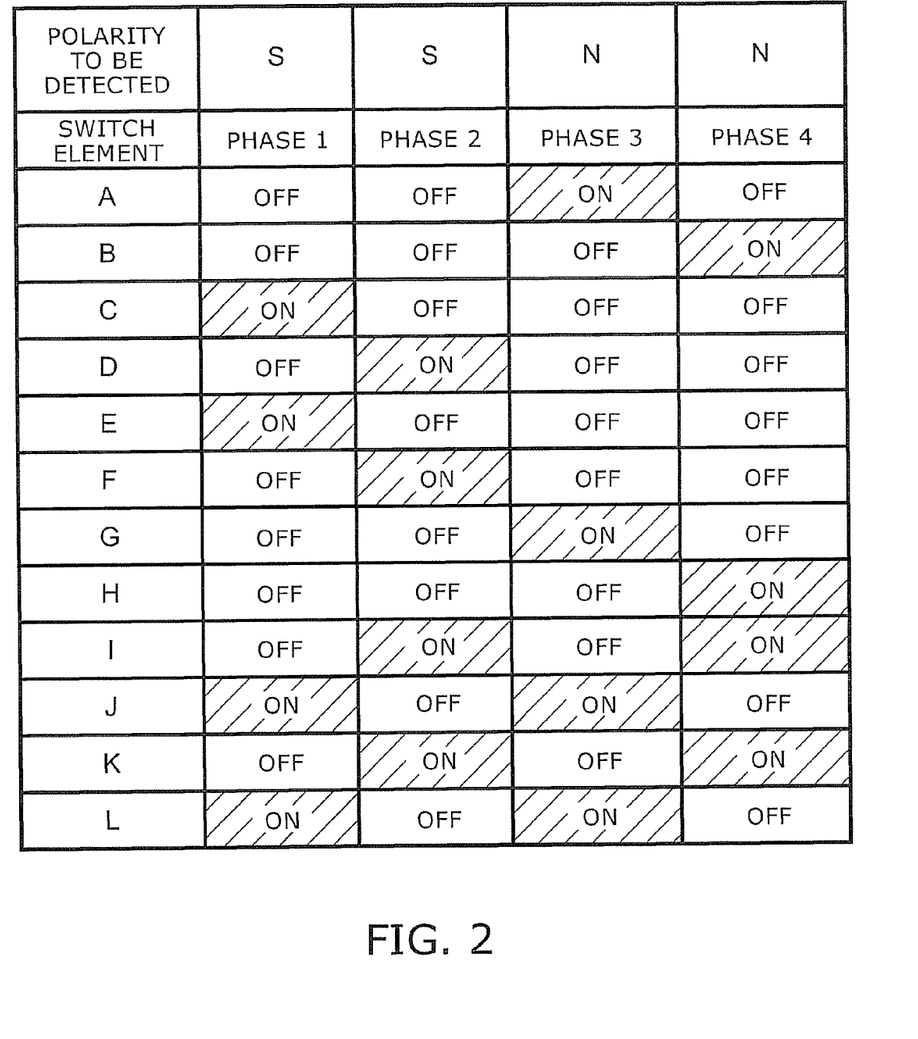
FIG. 2 is a view illustrating a method for driving the magnetic sensor shown in FIG. 1.

FIG. 2 illustrates a method for driving the magnetic sensor shown in FIG. 1.

Figure 3:
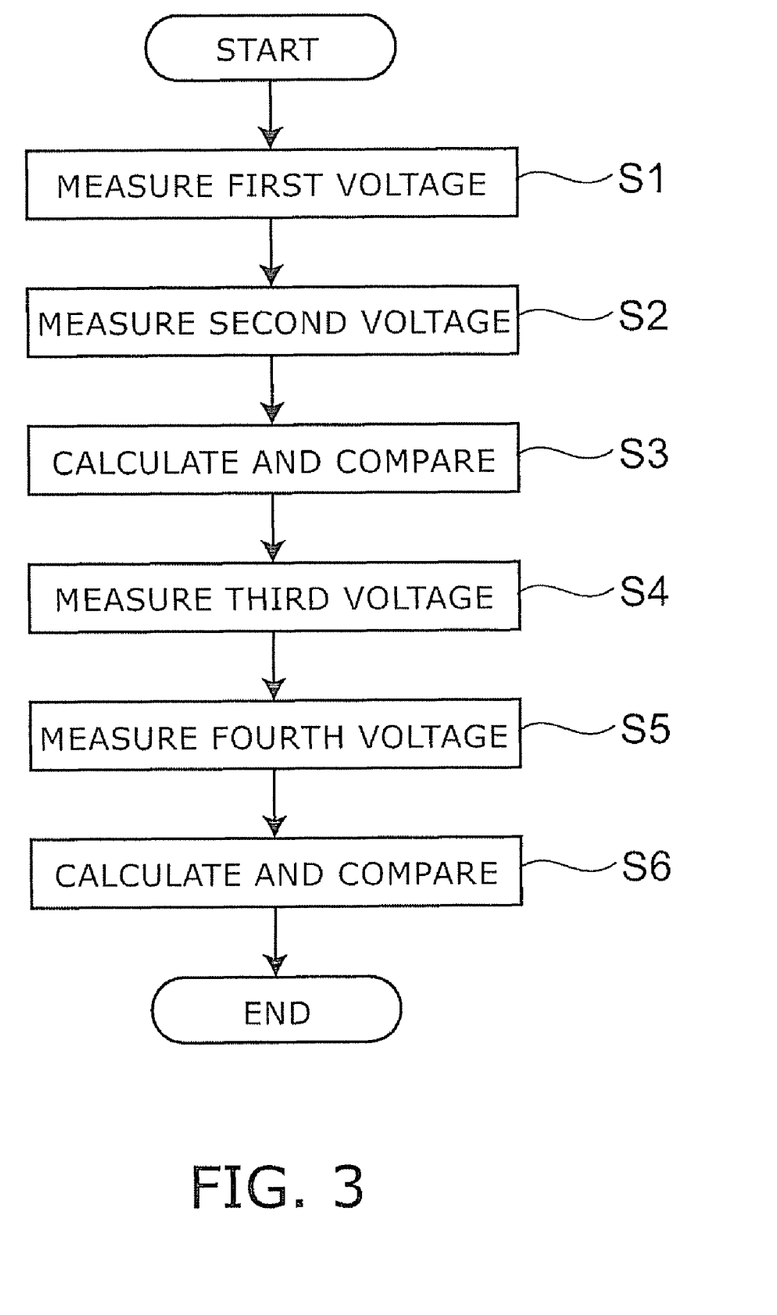
FIG. 3 is a flow chart illustrating a magnetic measurement method according to the first embodiment.

FIG. 3 is a flow chart illustrating a magnetic measurement method according to this embodiment.

FIGS. 4A to 4D illustrate the operation of the magnetic sensor according to this embodiment.

As shown in FIG. 3, the magnetic measurement method according to this embodiment includes four voltage measurement steps and two calculation/comparison steps. Steps S1-S3 shown in FIG. 3 determine whether S-pole magnetism is present above the Hall element 11. S-pole magnetism is present above the Hall element 11 in such cases where a magnet with its S-pole magnetism facing the Hall element 11 is placed above the Hall element 11. Furthermore, steps S4-S6 determine whether N-pole magnetism is present above the Hall element 11. In the following, the magnetic measurement method according to this embodiment is described in detail with reference to FIGS. 1 to 4.

First, as shown in step S1 of FIG. 3 and "phase 1" of FIG. 2, the switch elements C, E, J, and L of the switch circuit 12 are turned on, and the remaining switch elements are turned off. Thus, the terminal T3 of the Hall element 11 is connected to the potential Vdd through the switch element C, and the terminal T1 is connected to the potential GND through the switch element E. Hence, a current flows through the Hall element 11 along the direction (+X-direction) from the terminal T3 to the terminal T1. Furthermore, the terminal T2 is connected to the sense terminal α through the switch element J, and the terminal T4 is connected to the sense terminal β through the switch element L. This allows the voltage between the terminal T2 and the terminal T4 to be measured by measuring the voltage between the sense terminal α and the sense terminal β. Consequently, the voltage in the direction (+Y-direction) orthogonal to the current direction (+X-direction) can be measured. This voltage measured as a potential difference between the sense terminal α and the sense terminal β, that is, the measured voltage in the +Y-direction for a current passed along the +X-direction in phase 1, is referred to as "first voltage".

Figure 4A:
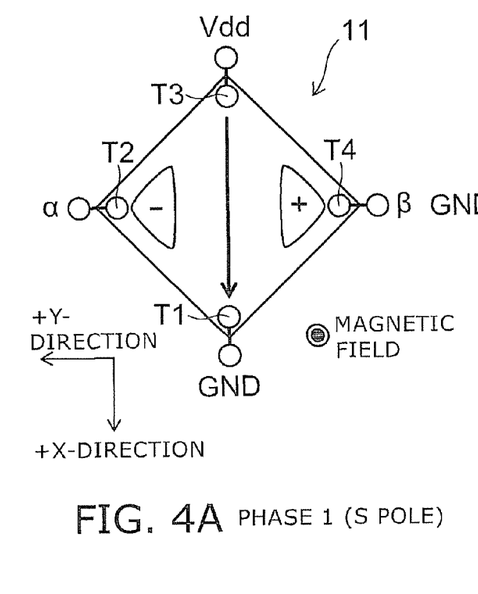
FIGS. 4A to 4D are views illustrating an operation of the magnetic sensor according to the first embodiment.

At this time, as shown in FIG. 4A, if S-pole magnetism is present above the Hall element 11, a magnetic field directed upward is applied to the Hall element 11. Hence, by the Fleming's rule, a force in the +Y-direction acts on electrons flowing in the Hall element 11, and the electrons are localized in the +Y-side portion of the Hall element 11. Consequently, a Hall voltage occurs between the terminal T2 and the terminal T4, with the terminal T4 being positive and the terminal T2 being negative. However, at this time, between the terminal T2 and the terminal T4, an offset voltage also occurs due to, for instance, the stress and shape error of the Hall element 11. Hence, the aforementioned first voltage is the sum of the Hall voltage and the offset voltage. That is, the following equation (1) holds.

(measured voltage)=(Hall voltage)+(offset voltage)   (1)

Next, as shown in step S2 of FIG. 3 and "phase 2" of FIG. 2, the switch elements D, F, I, and K of the switch circuit 12 are turned on, and the remaining switch elements are turned off. Thus, the terminal T4 is connected to the potential Vdd through the switch element D, and the terminal T2 is connected to the potential GND through the switch element F. Hence, a current flows through the Hall element 11 along the direction (+Y-direction) from the terminal T4 to the terminal T2. Furthermore, the terminal T1 is connected to the sense terminal a through the switch element I, and the terminal T3 is connected to the sense terminal β through the switch element K. This allows the voltage between the terminal T1 and the terminal T3 to be measured. This voltage, that is, the measured voltage in the +X-direction for a current passed along the +Y-direction in phase 2, is referred to as "second voltage".

Figure 4B:
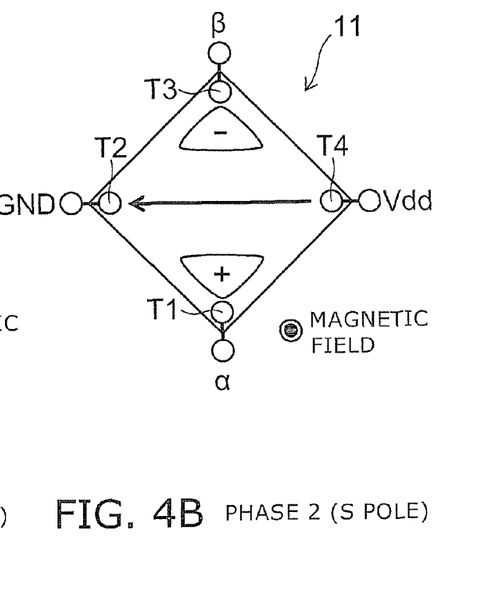

At this time, as shown in FIG. 4B, if S-pole magnetism is present above the Hall element 11, a magnetic field directed upward is applied to the Hall element 11. Hence, a force in the −X-direction acts on electrons flowing in the Hall element 11, and the electrons are localized in the −X-side portion of the Hall element 11. Consequently, a Hall voltage occurs between the terminal T3 and the terminal T1, with the terminal T1 being positive and the terminal T3 being negative. The aforementioned second voltage includes this Hall voltage as shown in the above equation (1).

Next, as shown in step S3 of FIG. 3, the first voltage value and the second voltage value described above are used to perform calculation which strengthens the effects of the Hall voltage mutually and weakens the effects of the offset voltage mutually, to obtain a calculation value. Specifically, between the sense terminals α and β, if the polarity of the Hall voltage in phase 1 is the same as the polarity of the Hall voltage in phase 2, the sum of the first voltage and the second voltage is obtained. On the other hand, if the polarity of the Hall voltage in phase 1 is opposite to the polarity of the Hall voltage in phase 2, the difference between the first voltage and the second voltage is obtained. For instance, in this embodiment, between the sense terminals α and β, the polarity of the Hall voltage in phase 1 and the polarity of the Hall voltage in phase 2 are opposite to each other. Hence, the difference between the first voltage value and the second voltage value is obtained and used as a calculation value. This calculation value is compared with a reference value, and if it is not less than the reference value, it is determined that S-pole magnetism is present.

In the above calculation value, as compared with the first and second voltage value, the effect of the Hall voltage is enhanced, and the effect of the offset voltage is canceled. However, the effect of the offset voltage is not totally canceled, but a residual component remains. That is, the calculation value includes a residual component besides the Hall voltage component as shown in the following equation (2).

(calculation value)=(Hall voltage component)+(residual component)   (2)

Next, as shown in step S4 of FIG. 3 and "phase 3" of FIG. 2, the switch elements A, G, J, and L of the switch circuit 12 are turned on, and the remaining switch elements are turned off. Thus, the terminal T1 of the Hall element 11 is connected to the potential Vdd through the switch element A, and the terminal T3 is connected to the potential GND through the switch element G. Hence, a current flows through the Hall element 11 along the direction (−X-direction) from the terminal T1 to the terminal T3. Furthermore, the terminal T2 is connected to the sense terminal α through the switch element J, and the terminal T4 is connected to the sense terminal β through the switch element L. This allows the voltage between the terminal T2 and the terminal T4 to be measured. This voltage, that is, the measured voltage in the −Y-direction for a current passed along the −X-direction in phase 3, is referred to as "third voltage".

Figure 4C:
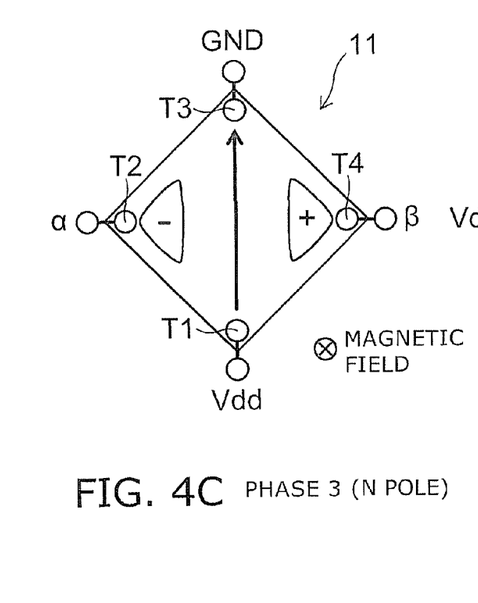

At this time, as shown in FIG. 4C, if N-pole magnetism is present above the Hall element 11, a magnetic field directed downward is applied to the Hall element 11. Hence, a force in the +Y-direction acts on electrons flowing in the Hall element 11, and the electrons are localized in the +Y-side portion of the Hall element 11. Consequently, a Hall voltage occurs between the terminal T2 and the terminal T4, with the terminal T2 being negative and the terminal T4 being positive. The aforementioned third voltage includes this Hall voltage.

Next, as shown in step S5 of FIG. 3 and "phase 4" of FIG. 2, the switch elements B, H, I, and K of the switch circuit 12 are turned on, and the remaining switch elements are turned off. Thus, the terminal T2 is connected to the potential Vdd through the switch element B, and the terminal T4 is connected to the potential GND through the switch element H. Hence, a current flows through the Hall element 11 along the direction (−Y-direction) from the terminal T2 to the terminal T4. Furthermore, the terminal T1 is connected to the sense terminal α through the switch element I, and the terminal T3 is connected to the sense terminal β through the switch element K. This allows the voltage between the terminal T3 and the terminal T1 to be measured. This voltage, that is, the measured voltage in the +X-direction for a current passed along the −Y-direction in phase 4, is referred to as "fourth voltage".

Figure 4D:
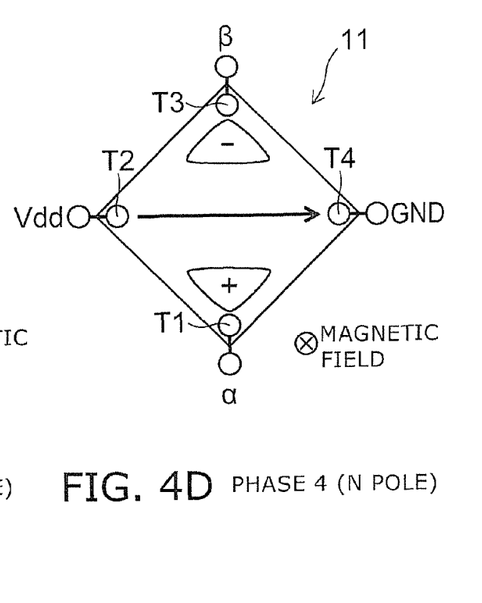

At this time, as shown in FIG. 4D, if N-pole magnetism is present above the Hall element 11, a magnetic field directed downward is applied to the Hall element 11. Hence, a force in the −X-direction acts on electrons flowing in the Hall element 11, and the electrons are localized in the −X-side portion of the Hall element 11. Consequently, a Hall voltage occurs between the terminal T1 and the terminal T3, with the terminal T1 being positive and the terminal T3 being negative. The aforementioned fourth voltage includes this Hall voltage.

Next, as shown in step S6 of FIG. 3, the third voltage value and the fourth voltage value described above are used to perform calculation which strengthens the effects of the Hall voltage mutually and weakens the effects of the offset voltage mutually. The calculation method is similar to the calculation in the above step S3. For instance, in this embodiment, between the sense terminals α and β, the polarity of the Hall voltage in phase 3 and the polarity of the Hall voltage in phase 4 are opposite. Hence, the difference between the third voltage value and the fourth voltage value is obtained. The value of this difference is compared with the reference value, and if it is not less than the reference value, it is determined that N-pole magnetism is present. Here, as shown in the above equation (2), the calculation value includes a Hall voltage component and a residual component.

In the following, the effect of this embodiment is described.

In this embodiment, the processing shown in steps S1-S3 can determine whether S-pole magnetism is present above the Hall element 11. Here, the first voltage is obtained in step S1, the second voltage is obtained in step S2, and the first voltage and the second voltage are used to perform calculation which strengthens the effects of the Hall voltage mutually and weakens the effects of the offset voltage mutually in step S3. Hence, in detecting S-pole magnetism, the effect of the offset voltage can be removed to some extent. Likewise, the processing shown in steps S4-S6 can determine whether N-pole magnetism is present near the magnetic sensor 1. Also in this case, the effect of the offset voltage can be removed to some extent.

However, even the above calculation cannot completely exclude the effect of the offset voltage, but the effect of a residual component remains in the calculation result. The effect of this residual component depends on the direction of the magnetic field to be detected and the direction of the current. Thus, in this embodiment, the direction of the current is reversed between the case of detecting S-pole magnetism (phases 1, 2) and the case of detecting N-pole magnetism (phases 3, 4). Hence, irrespective of whether the polarity of the magnetism to be detected is S pole or N pole, the polarity of the residual component can be appeared in the same direction. Thus, independent of the polarity of the magnetism to be detected, the correlation between the magnetic field strength and the above calculation result is identical, which allows accurate determination in determining the presence or absence of magnetism by comparison between the calculation value and the reference value. Here, if it is not necessary to distinguish the magnetism to be detected between S pole and N pole, it can be determined that magnetism is present when at least one of the detection result of S-pole magnetism and the detection result of N-pole magnetism is equal to or greater than the reference value.

In the following, this effect is described in detail by comparison with a comparative example.

Figure 5:
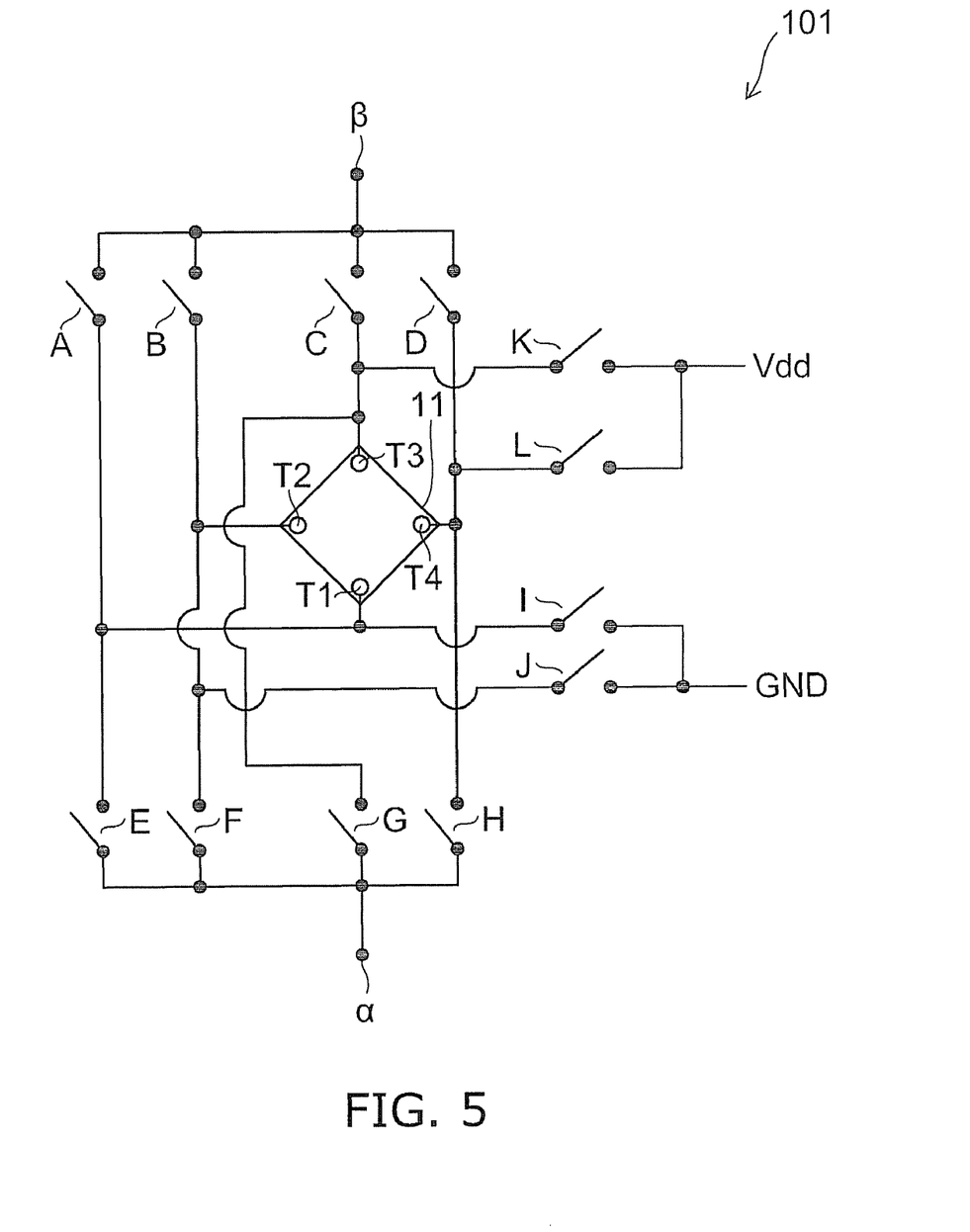
FIG. 5 is a circuit diagram illustrating a magnetic sensor according to a comparative example.

FIG. 5 is a circuit diagram illustrating a magnetic sensor according to the comparative example.

Figure 6:
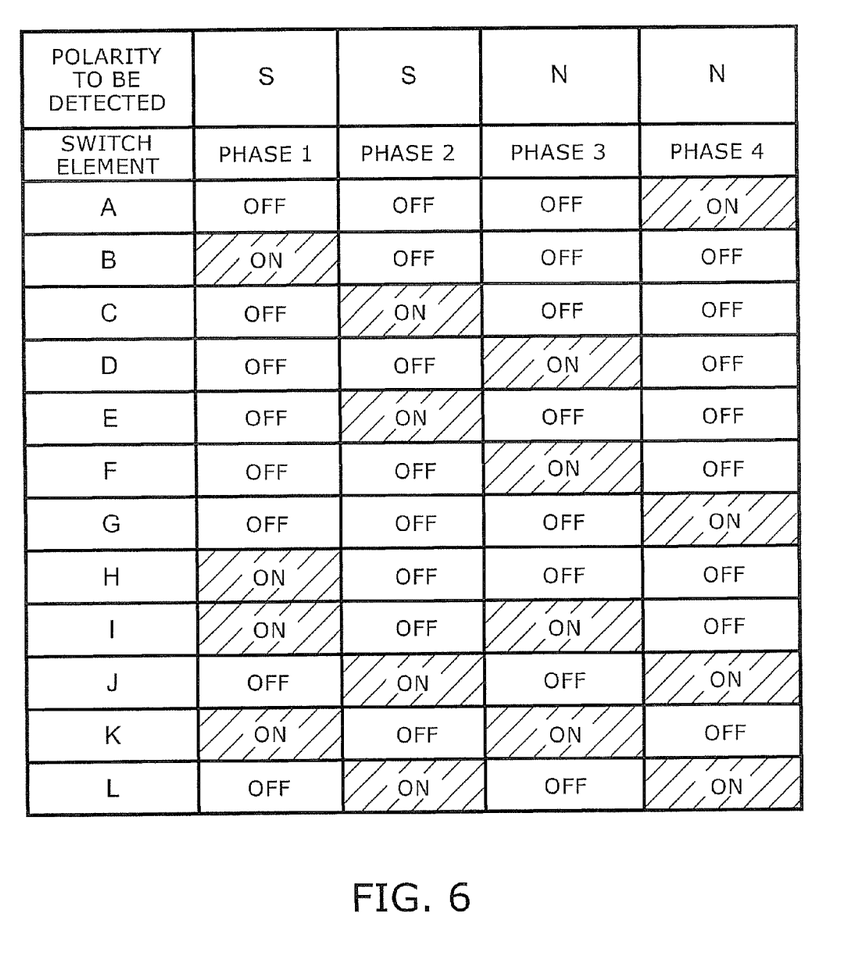
FIG. 6 is a view illustrating a method for driving the magnetic sensor shown in FIG. 5.
Figures 7A, 7B:
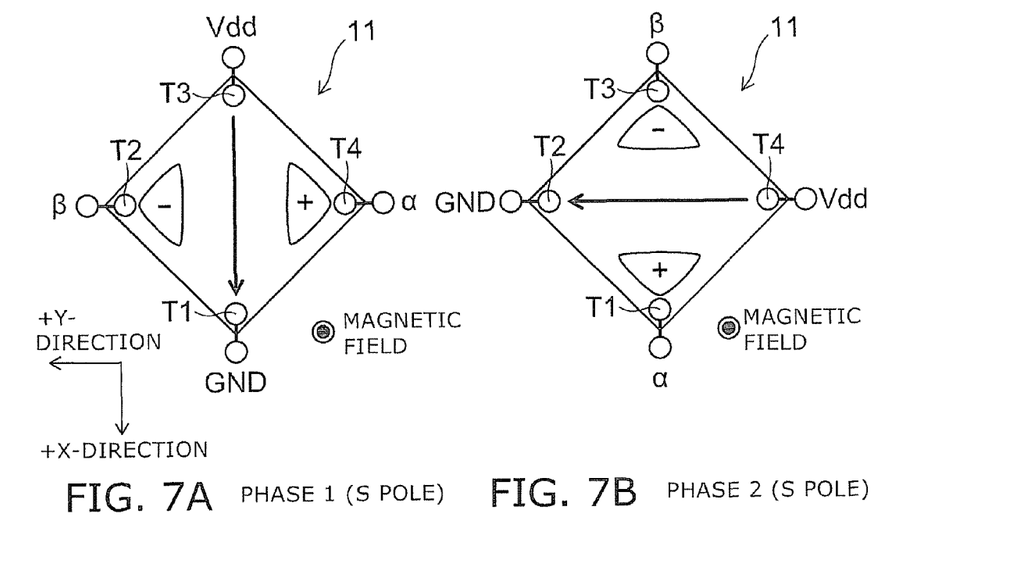
FIGS. 7A to 7D are views illustrating an operation of the magnetic sensor according to the comparative example.
Figures 7C, 7D:
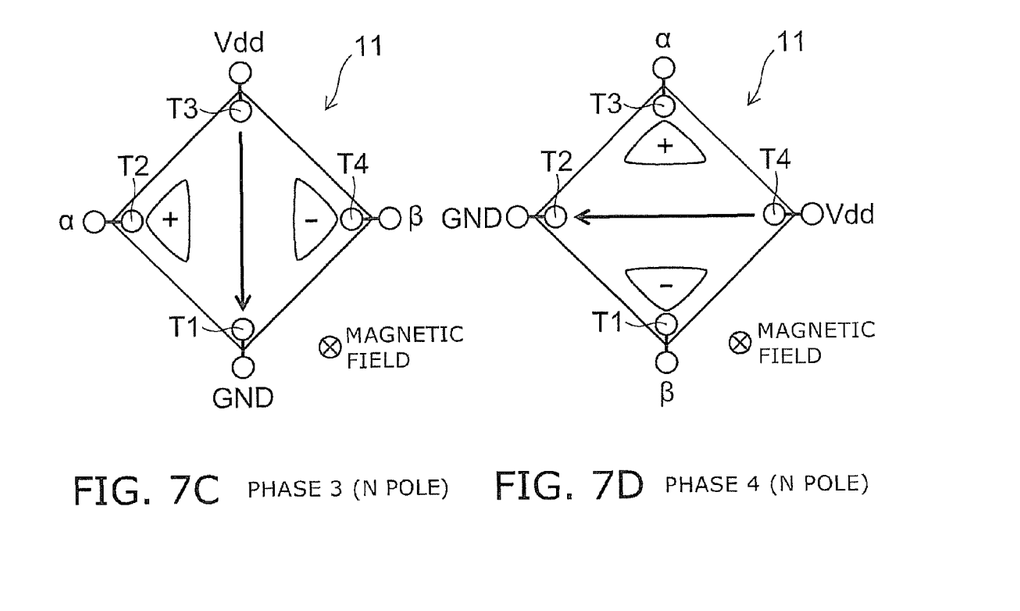

FIG. 6 illustrates a method for driving the magnetic sensor shown in FIG. 5.

FIGS. 7A to 7D illustrate the operation of the magnetic sensor according to this comparative example.

Figure 8A:
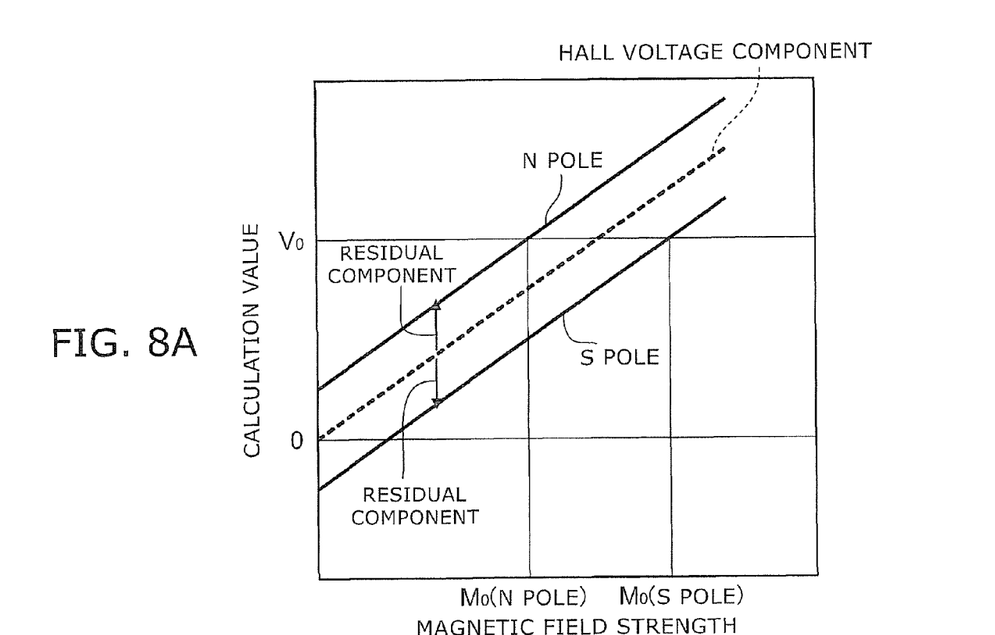
FIGS. 8A and 8B are graphs illustrating the effect of a residual component on a calculation value, where the horizontal axis represents magnetic field strength, and the vertical axis represents the calculation value.
Figure 8B:
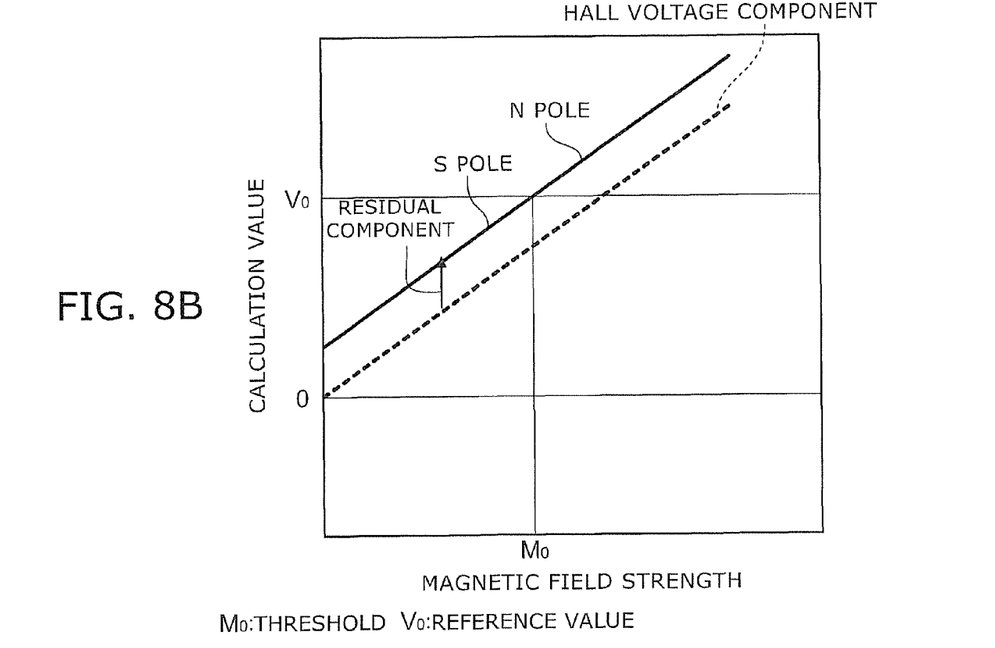

FIGS. 8A and 8B are graphs illustrating the effect of the residual component on the calculation value, where the horizontal axis represents magnetic field strength, and the vertical axis represents the calculation value. FIG. 8A shows the comparative example, and FIG. 8B shows the first embodiment.

As shown in FIG. 5, in the magnetic sensor 101 according to this comparative example, as compared with the magnetic sensor 1 (see FIG. 1) according to the first embodiment, the connecting positions of the potential Vdd and the potential GND are interchanged with the connecting positions of the sense terminals α and β. Furthermore, as shown in FIG. 6, the magnetic sensor 101 is different from the magnetic sensor 1 in the combinations of switch elements turned on in each phase.

If the switch elements of the combinations as shown in FIG. 6 are turned on, then in each phase, a current as shown in FIGS. 7A to 7D flows, and a Hall voltage occurs. Here, the current flowing direction is identical, independent of the polarity of the magnetism to be detected. That is, both in phase 1 (see FIG. 7A) for detecting S-pole magnetism and in phase 3 (see FIG. 7C) for detecting N-pole magnetism, the current flowing direction is the +X direction. Furthermore, both in phase 2 (see FIG. 7B) for detecting S-pole magnetism and in phase 4 (see FIG. 7D) for detecting N-pole magnetism, the current flowing direction is the +Y direction.

In this case, as shown in FIG. 8A, the polarity of the residual component occurring in the output result varies with the polarity of the magnetism to be detected. Thus, the threshold $M_0$ of magnetic field strength corresponding to the reference value $V_0$ of the calculation value varies with the polarity of the magnetism to be detected. Hence, the magnetic sensor 101 according to the comparative example has large variation in sensitivity due to the polarity of the magnetism to be detected, which results in low detection accuracy.

In contrast, as shown in FIG. 8B, in the magnetic sensor 1 according to this embodiment, the polarity of the residual component occurring in the output result is identical, independent of the polarity of the magnetism to be detected. Thus, the threshold $M_0$ of magnetic field strength corresponding to the reference value $V_0$ of the calculation value is identical, independent of the polarity of the magnetism to be detected. Hence, there is no variation in sensitivity due to the polarity of the magnetism, which results in high detection accuracy. Here, the calculation value in step S3 in the case where the magnetism to be detected is N pole, and the calculation value in step S6 in the case where the magnetism to be detected is S pole, are negative and do not affect the determination. Thus, the first embodiment can achieve accurate detection even if the polarity of the magnetism to be detected is unknown.

Next, a second embodiment of the invention is described.

Figure 9:
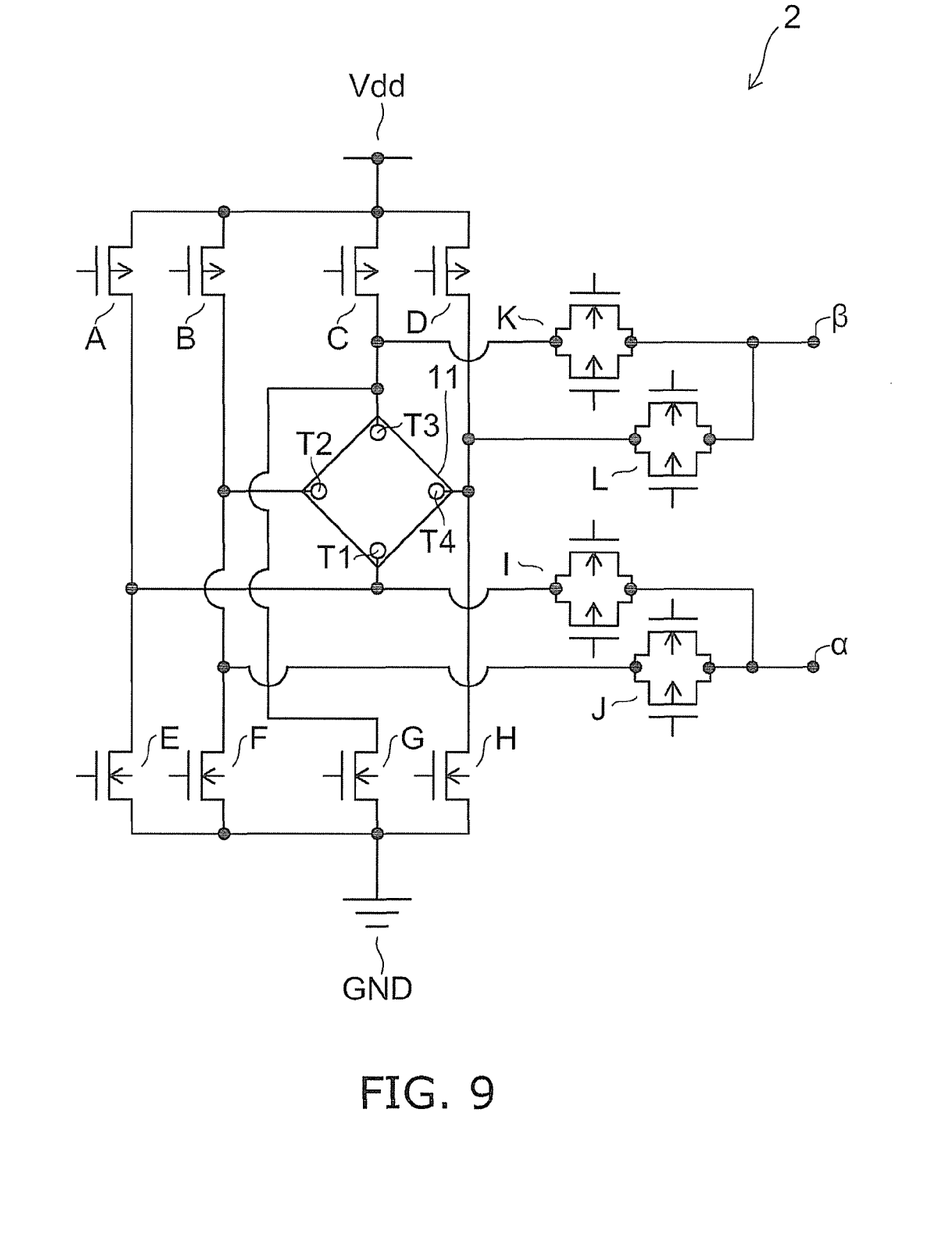
FIG. 9 is a circuit diagram illustrating a magnetic sensor according to a second embodiment of the invention.

FIG. 9 is a circuit diagram illustrating a magnetic sensor according to this embodiment.

Figure 10:
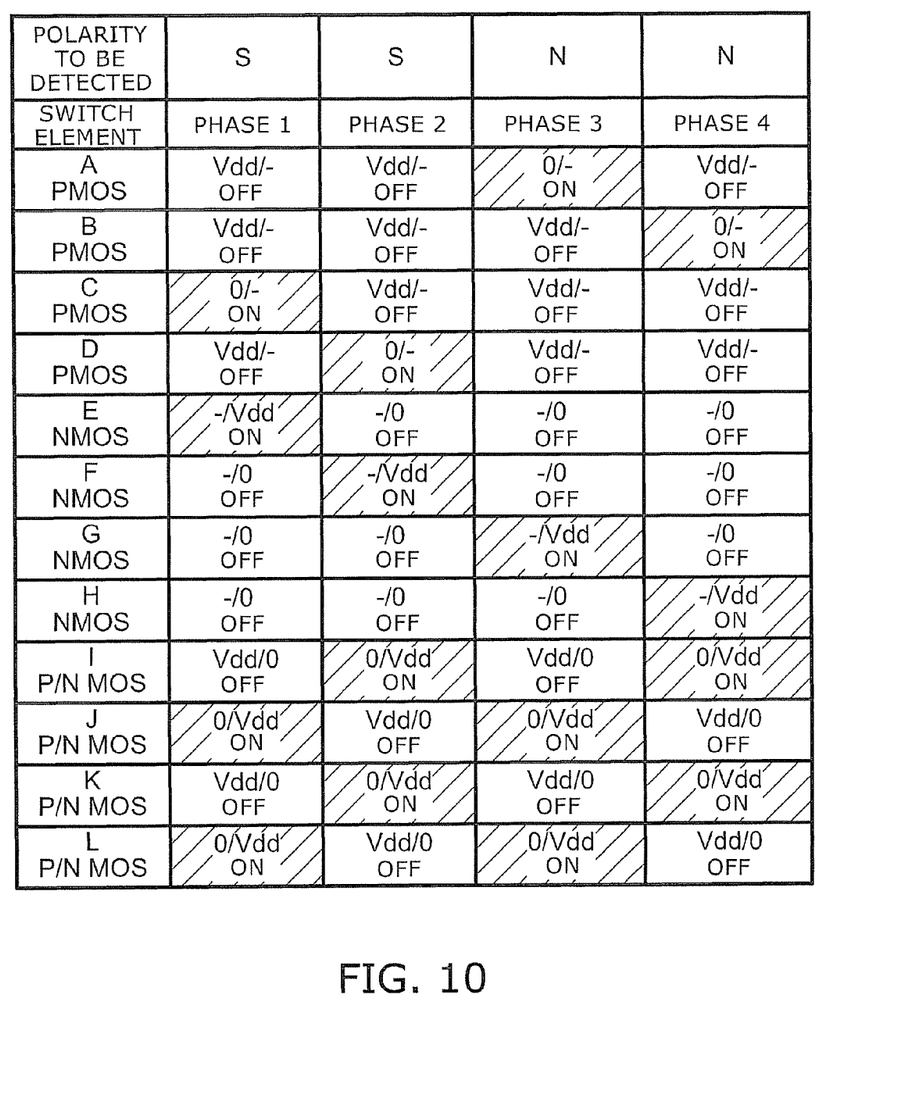
FIG. 10 is a view illustrating a method for driving the magnetic sensor shown in FIG. 9.

FIG. 10 illustrates a method for driving the magnetic sensor shown in FIG. 9.

In this embodiment, each switch element in the above first embodiment is implemented by a MOSFET (metal oxide semiconductor field effect transistor).

As shown in FIG. 9, in the magnetic sensor 2 according to this embodiment, the switch elements connected to the potential Vdd, that is, each of the switch elements A, B, C, and D, is implemented by a P-channel MOSFET (hereinafter referred to as "PMOS"). Furthermore, the switch elements connected to the potential GND, that is, each of the switch elements E, F, G, and H, is implemented by an N-channel MOSFET (hereinafter referred to as "NMOS"). Moreover, the switch elements connected to the sense terminal α or β, that is, each of the switch elements I, J, K, and L, is implemented by a set of a PMOS and an NMOS connected in parallel to each other. One of the potential Vdd and the potential GND is applied to the gate of each MOSFET. The MOSFET constituting each switch element is illustratively formed in the same silicon substrate as the Hall element 11. The configuration of this embodiment other than the foregoing is the same as that of the above first embodiment.

Next, a description is given of a method for driving the magnetic sensor 2 according to this embodiment, that is, a magnetic measurement method according to this embodiment.

As shown in FIGS. 9 and 10, in the magnetic sensor 2, the combinations of switch elements turned on in each voltage comparison step (phases 1-4) are the same as those in the magnetic sensor 1 (see FIGS. 1 and 2) according to the above first embodiment.

The upper description in each field of FIG. 10 represents potentials applied to the gate of the MOSFET. The left side of the slash (/) represents the potential applied to the gate of the PMOS, and the right side represents the potential applied to the gate of the NMOS. "0" represents the potential GND. The lower description in each field represents the conduction state of the switch element.

Like the magnetic measurement method (see FIG. 2) according to the above first embodiment, the magnetic measurement method according to this embodiment includes four voltage measurement steps and two calculation/comparison steps. Specifically, with regard to the PMOS constituting each switch element, the potential GND (0 V) is applied to the gate to turn it on, and the potential Vdd is applied to the gate to turn it off. With regard to the NMOS constituting each switch element, the potential Vdd is applied to the gate to turn it on, and the potential GND (0 V) is applied to the gate to turn it off.

For instance, as shown in FIG. 10, in phase 1, the potential GND (0 V) is applied to the gate of the PMOS constituting the switch element C to turn on this PMOS. Furthermore, the potential Vdd is applied to the gate of the NMOS constituting the switch element E to turn on this NMOS. Moreover, the potential GND (0 V) is applied to the gate of the PMOS constituting the switch elements J and L, and the potential Vdd is applied to the gate of the associated NMOS, to turn on the switch elements J and L. On the other hand, the potential Vdd is applied to the gate of the PMOS constituting each of the switch elements A, B, and D to turn it off. Furthermore, the potential GND (0 V) is applied to the gate of the NMOS constituting each of the switch elements F, G, and H to turn it off. Moreover, the potential Vdd is applied to the gate of the PMOS constituting the switch elements I and K, and the potential GND (0 V) is applied to the gate of the associated NMOS, to turn off the switch elements I and K. Thus, like phase 1 in the above first embodiment, the switch elements C, E, J, and L are turned on, and the remaining switch elements are turned off. Also in phases 2-4, the conduction state of the MOSFET constituting the switch elements is controlled likewise.

Next, a third embodiment of the invention is described.

Figure 11:
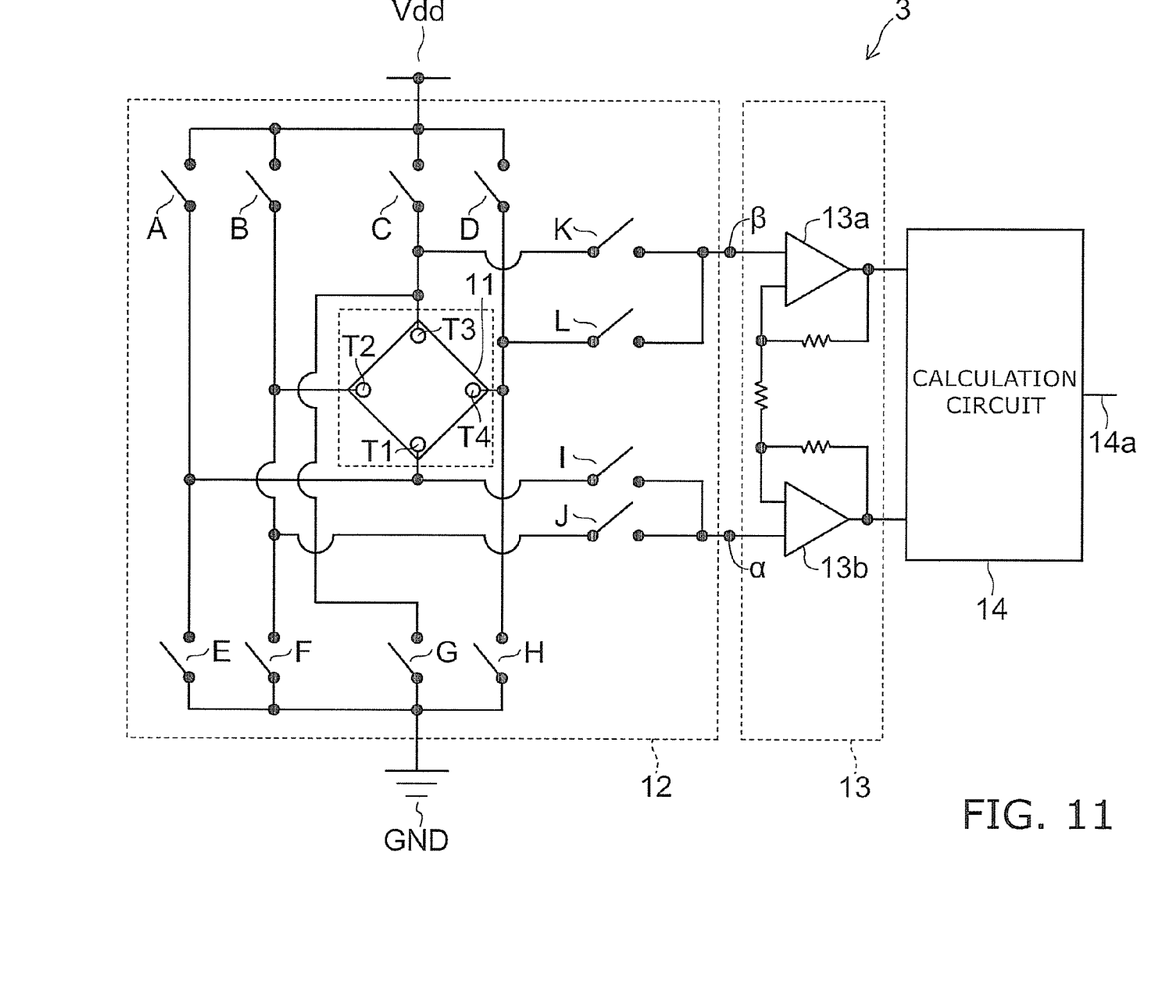
FIG. 11 is a circuit diagram illustrating a magnetic sensor according to a third embodiment of the invention.

FIG. 11 is a circuit diagram illustrating a magnetic sensor according to this embodiment.

As shown in FIG. 11, the magnetic sensor 3 according to this embodiment includes an amplification circuit 13 and a calculation circuit 14 in addition to the Hall element 11 and the switch circuit 12. The amplification circuit 13 serves to amplify the potential difference between the sense terminal α and the sense terminal β. The amplification circuit 13 includes two operational amplifiers 13a and 13b, the input terminals of which are connected to the sense terminals α and β, respectively. The output terminals of the operational amplifiers 13a and 13b are connected to the calculation circuit 14. The calculation circuit 14 calculates the sum or difference of two voltages between the output terminals of the operational amplifiers 13a and 13b inputted at different times to obtain a calculation value, and compares this calculation value with the reference value. The calculation circuit 14 is illustratively composed of capacitors and switches. The comparison result is outputted from the output terminal 14a of the calculation circuit 14.

Next, a description is given of a method for driving the magnetic sensor 3 according to this embodiment, that is, a magnetic measurement method according to this embodiment.

In this embodiment, the amplification circuit 13 amplifies the potential difference between the sense terminals α and β for output to the calculation circuit 14. The calculation circuit 14 performs the determination described in steps S3 and S6 (see FIG. 3) of the above first embodiment, and outputs the result at the output terminal 14a. According to this embodiment, even for a minute Hall voltage, the amplification circuit 13 amplifies the Hall voltage to allow accurate determination. The operation and effect of this embodiment other than the foregoing are the same as those of the above first embodiment.

The invention has been described with reference to the embodiments. However, the invention is not limited to these embodiments. For instance, the above embodiments can be practiced in combination with each other. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A magnetic sensor comprising:
a Hall element; and
a control device passing a current through the Hall element and measuring a voltage in the Hall element,
   passing a current through the Hall element along a first direction and measuring a first voltage in a second direction orthogonal to the first direction,
   passing a current through the Hall element along the second direction and measuring a second voltage in the first direction, passing a current through the Hall element along a third direction opposite to the first direction and measuring a third voltage in the second direction, passing a current through the Hall element along a fourth direction opposite to the second direction and measuring a fourth voltage in the first direction, performing calculation which strengthens effects of Hall voltage mutually and weakens effects of offset voltage mutually based on a value of the first voltage and a value of the second voltage by obtaining the sum of the first voltage and the second voltage when the polarity of the first voltage is same as the polarity of the second voltage or by obtaining the difference of the first voltage and the second voltage when the polarity of the first voltage is opposite to the polarity of the second voltage, and comparing a result thereof with a reference value, and performing calculation which strengthens effects of Hall voltage mutually and weakens effects of offset voltage mutually based on a value of the third voltage and a value of the fourth voltage by obtaining the sum of the third voltage and the fourth voltage when the polarity of the third voltage is same as the polarity of the fourth voltage or by obtaining the difference of the third voltage and the fourth voltage when the polarity of the third voltage is opposite to the polarity of the fourth voltage, and comparing a result thereof with the reference value.

2. The magnetic sensor according to claim 1, wherein the Hall element includes:
   a first terminal placed on downstream side of the first direction;
   a second terminal placed on downstream side of the second direction;
   a third terminal placed on downstream side of the third direction; and
   a fourth terminal placed on downstream side of the fourth direction,
the control device includes:
   a switch circuit switching connection relations of a high potential side power supply potential, a low potential side power supply potential, a first sense terminal, and a second sense terminal to the first to fourth terminals; and
   a calculation circuit performing the calculation and the comparison based on a voltage between the first sense terminal and the second sense terminal,
the switch circuit includes:
   a first switch element switching whether to connect the first terminal to the high potential side power supply potential;
   a second switch element switching whether to connect the second terminal to the high potential side power supply potential;
   a third switch element switching whether to connect the third terminal to the high potential side power supply potential;
   a fourth switch element switching whether to connect the fourth terminal to the high potential side power supply potential;
   a fifth switch element switching whether to connect the first terminal to the low potential side power supply potential;
   a sixth switch element switching whether to connect the second terminal to the low potential side power supply potential;
   a seventh switch element switching whether to connect the third terminal to the low potential side power supply potential;
   an eighth switch element switching whether to connect the fourth terminal to the low potential side power supply potential;
   a ninth switch element switching whether to connect the first terminal to the first sense terminal;
   a tenth switch element switching whether to connect the second terminal to the first sense terminal;
   an eleventh switch element switching whether to connect the third terminal to the second sense terminal; and
   a twelfth switch element switching whether to connect the fourth terminal to the second sense terminal, and
the switch circuit
   turns on the third, fifth, tenth, and twelfth switch elements and turns off the remaining switch elements in case of measuring the first voltage,
   turns on the fourth, sixth, ninth, and eleventh switch elements and turns off the remaining switch elements in case of measuring the second voltage,
   turns on the first, seventh, tenth, and twelfth switch elements and turns off the remaining switch elements in case of measuring the third voltage, and
   turns on the second, eighth, ninth, and eleventh switch elements and turns off the remaining switch elements in case of measuring the fourth voltage.

3. The magnetic sensor according to claim 2, wherein the control device further includes an amplification circuit amplifying the voltage between the first sense terminal and the second sense terminal outputted from the switch circuit and outputting the amplified voltage to the calculation circuit.

4. The magnetic sensor according to claim 2, wherein
   each of the first to fourth switch elements is a P-channel field effect transistor,
   each of the fifth to eighth switch elements is an N-channel field effect transistor, and
   each of the ninth to twelfth switch elements is a set of a P-channel field effect transistor and an N-channel field effect transistor connected in parallel to each other.

5. The magnetic sensor according to claim 1, further comprising:
   a silicon substrate,
   wherein the Hall element includes an impurity diffusion region formed in an upper portion of the silicon substrate and electrically isolated from its surroundings.

6. The magnetic sensor according to claim 5, wherein the impurity diffusion region has a shape having fourfold symmetry with respect to its central axis as viewed in a direction perpendicular to an upper surface of the silicon substrate.

7. The magnetic sensor according to claim 1, further comprising:
   a silicon substrate,
   wherein the Hall element includes:
      an impurity diffusion region formed in an upper portion of the silicon substrate, electrically isolated from its surroundings, and having a square shape as viewed in a direction perpendicular to an upper surface of the silicon substrate;
      a first terminal placed on downstream side of the first direction;
      a second terminal placed on downstream side of the second direction;
      a third terminal placed on downstream side of the third direction; and a fourth terminal placed on downstream side of the fourth direction, and the first to fourth terminals are placed at respective vertex sides of the square.

8. The magnetic sensor according to claim 7, wherein the control device includes:
   a switch circuit switching connection relations of a high potential side power supply potential, a low potential side power supply potential, a first sense terminal, and a second sense terminal to the first to fourth terminals; and
   a calculation circuit performing the calculation and the comparison based on a voltage between the first sense terminal and the second sense terminal, and
   the switch circuit is constituted by a field effect transistor formed in the silicon substrate.

9. A magnetic sensor comprising:
   a Hall element including a first to fourth terminals sequentially placed along one rotational direction at a peripheral portion thereof; and
   a switch circuit switching connection relations of a high potential side power supply potential, a low potential side power supply potential, a first sense terminal, and a second sense terminal to the first to fourth terminals,
   the switch circuit including:
      a first switch element switching whether to connect the first terminal to the high potential side power supply potential;
      a second switch element switching whether to connect the second terminal to the high potential side power supply potential;
      a third switch element switching whether to connect the third terminal to the high potential side power supply potential;
      a fourth switch element switching whether to connect the fourth terminal to the high potential side power supply potential;
      a fifth switch element switching whether to connect the first terminal to the low potential side power supply potential;
      a sixth switch element switching whether to connect the second terminal to the low potential side power supply potential;
      a seventh switch element switching whether to connect the third terminal to the low potential side power supply potential;
      an eighth switch element switching whether to connect the fourth terminal to the low potential side power supply potential;
      a ninth switch element switching whether to connect the first terminal to the first sense terminal;
      a tenth switch element switching whether to connect the second terminal to the first sense terminal;
      an eleventh switch element switching whether to connect the third terminal to the second sense terminal; and
      a twelfth switch element switching whether to connect the fourth terminal to the second sense terminal.

10. The magnetic sensor according to claim 9, further comprising:
    a calculation circuit
       performing calculation which strengthens effects of Hall voltage mutually and weakens effects of offset voltage mutually, based on a value of a first voltage between the first sense terminal and the second sense terminal, the value being obtained when turning on the third, fifth, tenth, and twelfth switch elements and turning off the remaining switch elements, and a value of a second voltage between the first sense terminal and the second sense terminal, the value being obtained when turning on the fourth, sixth, ninth, and eleventh switch elements and turning off the remaining switch elements, by obtaining the sum of the first voltage and the second voltage when the polarity of the first voltage is same as the polarity of the second voltage or by obtaining the difference of the first voltage and the second voltage when the polarity of the first voltage is opposite to the polarity of the second voltage, and comparing a result thereof with a reference value, and
    performing calculation which strengthens effects of Hall voltage mutually and weakens effects of offset voltage mutually, based on a value of a third voltage between the first sense terminal and the second sense terminal, the value being obtained when turning on the first, seventh, tenth, and twelfth switch elements and turning off the remaining switch elements, and a value of a fourth voltage between the first sense terminal and the second sense terminal, the value being obtained when turning on the second, eighth, ninth, and eleventh switch elements and turning off the remaining switch elements, by obtaining the sum of the third voltage and the fourth voltage when the polarity of the third voltage is same as the polarity of the fourth voltage or by obtaining the difference of the third voltage and the fourth voltage when the polarity of the third voltage is opposite to the polarity of the fourth voltage, and comparing a result thereof with the reference value.

11. The magnetic sensor according to claim 10, wherein
    the calculation based on the value of the first voltage and the value of the second voltage calculates a sum of the first voltage and the second voltage when polarity of Hall voltage at the first voltage is the same as polarity of Hall voltage at the second voltage, and calculates a difference between the first voltage and the second voltage when the polarity of Hall voltage at the first voltage is opposite to the polarity of Hall voltage at the second voltage, and
    the calculation based on the value of the third voltage and the value of the fourth voltage calculates a sum of the third voltage and the fourth voltage when polarity of Hall voltage at the third voltage is the same as polarity of Hall voltage at the fourth voltage, and calculates a difference between the third voltage and the fourth voltage when the polarity of Hall voltage at the third voltage is opposite to the polarity of Hall voltage at the fourth voltage.

12. The magnetic sensor according to claim 9, wherein
    each of the first to fourth switch elements is a P-channel field effect transistor,
    each of the fifth to eighth switch elements is an N-channel field effect transistor, and
    each of the ninth to twelfth switch elements is a set of a P-channel field effect transistor and an N-channel field effect transistor connected in parallel to each other.

13. The magnetic sensor according to claim 9, further comprising:
    a silicon substrate,
    wherein the Hall element further includes an impurity diffusion region formed in an upper portion of the silicon substrate and electrically isolated from its surroundings.

14. The magnetic sensor according to claim 13, wherein the impurity diffusion region has a shape having fourfold symmetry with respect to its central axis as viewed in a direction perpendicular to an upper surface of the silicon substrate.

15. The magnetic sensor according to claim 14, wherein the impurity diffusion region has a square shape as viewed in the direction perpendicular to the upper surface of the silicon substrate, and the first to fourth terminals are placed at respective vertex sides of the square.

16. A magnetic sensor comprising:

a Hall element; and a control device passing a current through the Hall element and measuring a voltage in the Hall element, the control device allowing polarity of a residual component in detecting S-pole magnetism and polarity of a residual component in detecting N-pole magnetism to be appeared in same direction by successively passing a current in orthogonal directions to successively measure a voltage in a direction orthogonal to both a direction of the magnetism and the current, and performing calculation which strengthens effects of Hall voltage mutually and weakens effects of offset voltage mutually based on values of the successively measured voltages, in each of detecting S-pole magnetism and detecting N-pole magnetism, the calculation calculating a sum of the values of the successively measured voltages when polarity of Hall voltage at the successively measured voltages are identical to each other, and calculating a difference between the values of the successively measured voltages when the polarity of Hall voltage at the successively measured voltages are opposite to each other.

17. The magnetic sensor according to claim 16, wherein the control device determines that magnetism is present when at least one of a result of detecting the S-pole magnetism and a result of detecting the N-pole magnetism is not less than a reference value.

18. A magnetic measurement method comprising:

passing a current through a Hall element along a first direction and measuring a first voltage in a second direction orthogonal to the first direction;

passing a current through the Hall element along the second direction and measuring a second voltage in the first direction;

passing a current through the Hall element along a third direction opposite to the first direction and measuring a third voltage in the second direction;

passing a current through the Hall element along a fourth direction opposite to the second direction and measuring a fourth voltage in the first direction;

performing calculation which strengthens effects of Hall voltage mutually and weakens effects of offset voltage mutually based on a value of the first voltage and a value of the second voltage by obtaining the sum of the first voltage and the second voltage when the polarity of the first voltage is same as the polarity of the second voltage or by obtaining the difference of the first voltage and the second voltage when the polarity of the first voltage is opposite to the polarity of the second voltage, and comparing a result thereof with a reference value; and performing calculation which strengthens effects of Hall voltage mutually and weakens effects of offset voltage mutually based on a value of the third voltage and a value of the fourth voltage by obtaining the sum of the third voltage and the fourth voltage when the polarity of the third voltage is same as the polarity of the fourth voltage or by obtaining the difference of the third voltage and the fourth voltage when the polarity of the third voltage is opposite to the polarity of the fourth voltage, and comparing a result thereof with the reference value.

* * * * *